United States Patent [19]

Koike et al.

[11] Patent Number: 4,458,151
[45] Date of Patent: Jul. 3, 1984

[54] ELECTRON MICROSCOPE OF A SCANNING TYPE

[76] Inventors: Hirotami Koike, 2741-7, Hane, Hamura-cho, Nishitama-gun, Tokyo; Takashi Yanaka, 476, Hodokubo, Hino-shi, Tokyo; Masaru Watanabe, 17-34, Shemorenjaku 6-chome, Mutaka-shi, Tokyo, all of Japan

[21] Appl. No.: 430,617

[22] Filed: Sep. 30, 1982

Related U.S. Application Data

[63] Continuation of Ser. No. 326,763, Dec. 2, 1981,, which is a continuation of Ser. No. 133,818, Mar. 25, 1980, abandoned.

[30] Foreign Application Priority Data

Apr. 10, 1979 [JP] Japan .................................. 54-42506

[51] Int. Cl.$^3$ ............................................. G01N 23/00
[52] U.S. Cl. .................................................. 250/310
[58] Field of Search ........................ 250/311, 310, 441

[56] References Cited

U.S. PATENT DOCUMENTS 3,509,335  4/1970  Nixon ................................... 250/311
3,872,305  3/1975  Koike ................................... 250/311
4,066,905  1/1978  Dussler et al. ....................... 250/311
4,121,100 10/1978  Kubozoe et al. ..................... 250/311

Primary Examiner—Bruce C. Anderson
Attorney, Agent, or Firm—Richard L. Aitken; Joseph M. Lane; Ronald P. Kananen

[57] ABSTRACT

An electron microscope of a scanning type provided with two specimen stages for allowing specimens of a large size and a small size to be selectively and interchangeably observed. The microscope comprises an electron gun, a first objective lens for observing a small size specimen, a second objective lens for observing a large size specimen, the second objective lens being disposed in axial opposition to the electron gun with the first objective lens disposed therebetween. The specimen stage for the small size specimen is disposed in the vicinity of the first objective lens, while the specimen stage for the large size specimen is disposed near the focal plane of the second objective lens. Improved stability, high resolving power and simplified manipulatability are attained.

3 Claims, 6 Drawing Figures

ELECTRON MICROSCOPE OF A SCANNING TYPE

This is a continuation of application Ser. No. 326,763, filed Dec. 2, 1981 which is a continuation of Ser. No. 133,818—filed Mar. 25, 1980 (now abandoned).

BACKGROUND OF THE INVENTION

1. Field of the Invention

The present invention relates in general to an electron microscope of a scanning type and more particularly concerns an improvement in a scanning type electron microscope which is provided with two specimen stages so that a high resolution image of a specimen having a small size and a specimen of a large size can be interchangeably observed.

2. Description of the Prior Art

In general, in contrast to a beam transmitting type electron microscope, it is required in the case of the scanning type that a specimen to be examined can be displaced or moved over a large range to thereby allow the whole surface of a specimen to be observed even when the specimen is of a large size (e.g. 10 cm in diameter and 7.5 cm in thickness). In this connection, description will be made in some detail on hitherto known scanning type electron microscopes referring to FIGS. 1 and 2. As is shown in FIG. 1, in order to meet the requirement described above, a specimen stage 1 is disposed behind an objective lens 2, whereby a specimen may be displaced two-dimensionally for a great distance, tilted in a range of $-10°$ to $90°$ and/or rotated for $360°$. However, movement of the specimen over such great range not only makes the specimen stage to be very susceptible to vibrations but also gives rise to drift of the specimen due to thermal expansion of the specimen stage involving eventually instability of the produced specimen image. Further, because of a large distance between the specimen and the objective lens 2, various aberrations become significant. A large volume of a specimen chamber 3 for accommodating specimens of large size makes it difficult to maintain a high vacuum level within the lens column and provides additional problems such as contamination (e.g. deposition of carbon on the specimen surface). Such being the circumstances, many difficulties are encountered in attaining a high resolution power. As an approach to solve these problems, it has been proposed to use in combination with a hitherto known transmissive type electron microscope a removably attached device for inserting the specimen between magnetic poles of the objective lens of the microscope. With such arrangement, it is however impossible to observe large size specimens. That is, the inherent characteristic feature of the scanning type electron microscope will be lost.

In view of the foregoing situation, there has been proposed a structure of a scanning type electron microscope of a structure such as shown in FIG. 2 for allowing a large size specimen to be observed in addition to observation of a small size specimen with a high resolution power. As can be seen from FIG. 2, there are provided a chamber 4 for accommodating a large size specimen and a chamber 5 for a small size specimen. This structure however suffers from various shortcomings described below due to the disposition of the large-size-specimen chamber 4 over the small-size-specimen chamber 5. That is:

(7) Since other devices such as specimen transfer mechanism, X-ray spectrometer or the like in addition to the specimen stage 1 have to be provided within the chamber 4 for the large size specimen, the center of gravity of the whole lens column is located at a higher position, involving structural or positional unstability as well as degraded resolution power due to susceptibility to adverse vibrations.

(2) When a small size specimen is observed by using a specimen stage disposed within the chamber 5, the chamber 4 for the large size specimen which is not used at that time has to be evacuated to a desired vacuum level (about $10^{-5}$ Torr), which means that a lot of time is required for the evacuation. Further, it is difficult to maintain the small-size-specimen chamber at the desired vacuum level due to the fact that the out gasing from the inner walls or other parts of the large-size-specimen chamber will flow into the chamber for the small size specimen.

(3) Because of the presence of a large aperture formed in a side wall of the large-size-specimen chamber 4 for inserting the specimen table 1 into the chamber, the electron beam is likely to be subjected to disturbing influences of external magnetic field through the aperture.

(4) Since the objective lens for observing the specimen of a small size is installed at the bottom portion of the lens column assembly, it is difficult to mount other lens below the objective lens 8, imposing limitations to the performances (e.g. contrast, resolution, sensitivity) in producing transmitting/scanning image (i.e. STEM image), electron diffraction image, energy loss image.

SUMMARY OF THE INVENTION

An object of the invention is to provide an improved electron microscope of scanning type which is substantially immune to the drawbacks of the hitherto known electron microscopes described above.

Another object of the invention is to provide a scanning type electron microscope provided with two specimen tables for allowing specimens of a small size and a large size to be interchangeably observed with a desired resolution without being subjected to undesirable vibrations.

Further object of the invention is to provide the electron microscope of the above mentioned type which can be evacuated to a desired vacuum level for observation of a specimen of a small size and in which the scanning electron beam is insusceptible to disturbing influences of external magnetic fields.

According to a general feature of the invention, there is provided an electron microscope of a scanning type having an electron optical system which comprisies en electron gun, a first objective lens for observing a specimen of a small size, a second objective lens serving to observe a specimen of a large size and disposed in axial opposition to the electron gun with the first objective lens being interposed therebetween, a first specimen stage disposed adjacent to the first objective lens for presenting the small size specimen between magnetic poles of the first objective lens, a second specimen table disposed below the second objective lens for presenting the large size specimen at a location in the vicinity of focal place of the second objective lens, and means for allowing the small size specimen and the large size specimen to be selectively or interchangeably observed.

Above and other objects, features and advantages of the present invention will become more apparent from the following description of the exemplary embodiments of the invention taken in conjunction with the accompanying drawings.

DETAILED DESCRIPTION OF THE PREFERRED EMBODIMENTS

Now, the invention will be described in detail in conjunction with exemplary embodiments of the scanning type electron microscope according to the invention.

Figure 1:
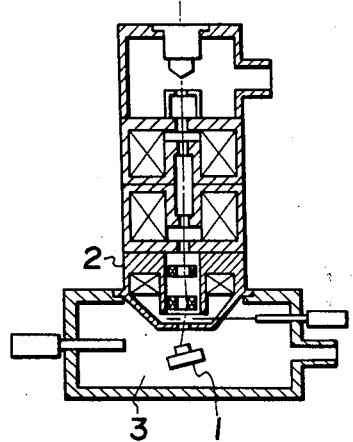
FIG. 1 is a vertical sectional view showing a hitherto known electron microscope of a scanning type.
Figure 2:
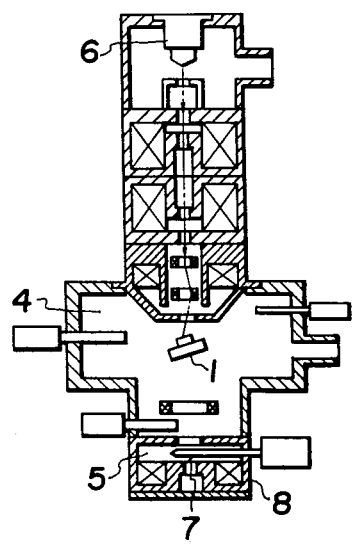
FIG. 2 shows in a vertical sectional view another known scanning type electron microscope.
Figure 3:
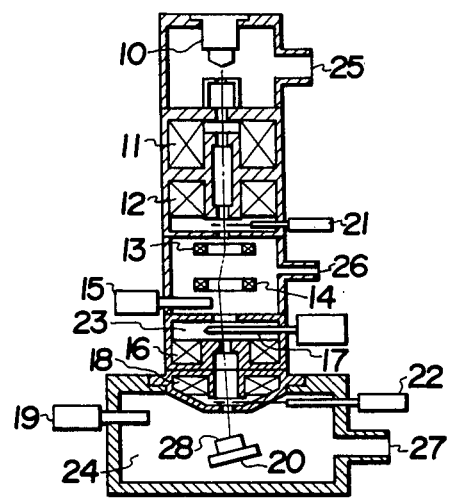
FIG. 3 shows in a vertical sectional view a scanning type electron microscope provided with two specimen table according to an embodiment of the invention.

Referring to FIG. 3 which shows in a longitudinal sectional view the scanning type electron microscope according to an embodiment of the invention, an electronic optical system comprises an electron gun 10, focussing lenses 11 and 12, a first deflecting coil 13, a second deflecting coil 14, a first secondary electron detector 15 for a specimen of a small size, a first objective lens 16 for observing the specimen of a small size, a first specimen stage 17 for supporting the small size specimen, a second objective lens 18 for observing a specimen of a large size, a second secondary electron detector 19 for the large size specimen and a second specimen stage 20 for the large size specimen. An electron beam flux emitted by the electron gun 10 is focussed through the focussing lenses 11 and 12 and deflected by the first and the second deflecting coils 13 and 14 so that a two-dimensional scanning of the specimen with the electron beam is attained. The electron beam deflected through the first and the second deflecting coils 13 and 14 is further focussed through the first objective lens 16 or the second objective lens 18 onto the specimen so as to have a beam diameter on the order of 100 Å on a surface of the specimen. Secondary electrons emitted from the surface of the specimen as the result of the scanning by the electron beam are detected by the first or secondary electron detectors 15 or 19 to be converted into a corresponding electric signal which is amplified or processed to display a two-dimensional image on a cathode ray tube (CRT) or the like in correspondence to the two-dimensional scanning described above. In FIG. 3, reference numeral 21 denotes a stop for the focussing lenses 11 and 12, 22 denotes a stop for the secondary objective lens, 23 deonotes a specimen chamber for placing therein the small size specimen, 24 denotes a specimen chamber for the large size specimen, and numerals 25, 26 and 27 denote evacuating ports, respectively.

It can be seen from FIG. 3 that the first objective lens 16 for observing the specimen of a small size is disposed above the second objective lens 18 for oberving the large size specimen, and that the first specimen support stage 17 for the small size specimen is disposed within the specimen chamber 23 defined between the magnetic poles of the first objective lens 16. Disposed immediately above the specimen chamber 23 for the small size specimen is a first secondary electron detector 15 which serves to detect secondary electrons emitted from the scanned surface of the specimen placed on the first specimen stage 17.

On the other hand, the second objective lens 18 for observing the specimen of a large size is disposed below the first objective lens 16. The specimen chamber 24 for receiving therein the large size specimen is provided below the second objective lens 18. The second specimen stage 20 for placing thereon the large size specimen is disposed within the second specimen chamber 24 in the vicinity of the focal plane of the second objective lens 18, while the second secondary electron detector 19 for detecting the secondary electrons emitted from the scanned surface of the large size specimen 28 is positioned at a side of the second specimen table 20. The lens column assembly including the various components described above can enjoy a high stability by virtue of the fact that the specimen chamber 24 for the large size specimen is disposed at the bottom portion of the lens column since the center of gravity of the whole electron microscope structure is at a relatively low position.

For observing a specimen 28 of a small size, the first objective lens 16, the first specimen stage 17 and the first secondary electron detector 15 ar used. In this case, the specimen to be examined is placed at the center of the magnetic field produced by the first objective lens 16, thereby allowing the specimen to be observed with a significantly reduced aberration of the electron optical lens system. Further, the first specimen stage 17 is not required to be displaced or adjusted in position ove a wide range. Consequently, the specimen table is very insusceptible to vibrations, whereby the fine positional adjustment of the specimen can be attained with a high accuracy, resulting in an image of a high resolution power.

When a specimen of a large size is to be observed, the second objective lens 18, the second specimen stage 20 and the second secondary electron detector 19 are used. In this case, it is possible to observe the image of the large size specimen through scanning with the electron beam in a quite similar manner as is in the case of a conventional electron microscope of scanning type. In this connection, it is to be noted that the first specimen stage 17 has to be beforehand removed, while the power source must be changed over to the second objective lens 18 from the first objective lens.

Figure 4:
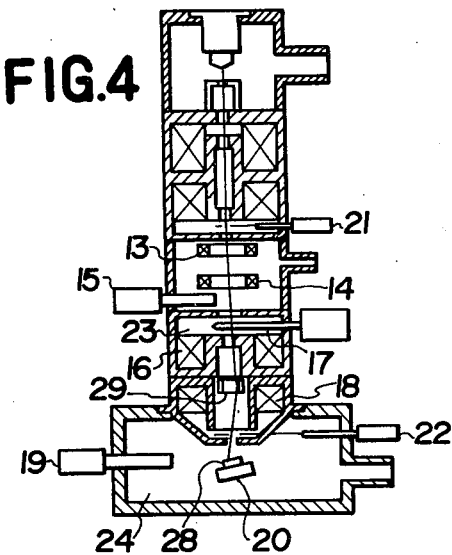
FIG. 4 shows in a vertical sectiona view a scanning type electron microscope according to a second embodiment of the invention.

FIG. 4 shows in a vertical sectional view a scanning type electron microscope according to a second embodiment of the invention. The electron microscope shown in FIG. 4 primarily differs from the one shown in FIG. 3 in that a third deflection coil 29 is disposed between the first objective lens 16 and the second objective lens 18 to be used for observing a specimen 28 of a large size. In this connection, it should be remarked that when a large size specimen is to be observed through the electron microscope shown in FIG. 3 at a low magnification, the path of the electron beam deflected through the second deflecting coil 14 may possibly be deviated from the center of the first objective lens 16, involving a significantly large aberration, or the electron beam may be interrupted by the inner peripheral portion of the first objective lens, making it impossible to scan the surface of the large size specimen 28, because the second specimen stage 20 is spaced from the second deflecting coil 14 at a great distance. With a view to obviating such problem, the third deflecting coil 29 is provided at an intermediate position between the first objective lens 16 and the second objective lens 18 according to the embodiment shown in FIG. 4 so that the electron beam may pass through the center of the first objective lens 16. With the arrangement shown in FIG. 4, it is possible to obtain a scanned image of a specimen 28 having a large size with a reduced aberration. In reality, it has been found that the aberration is reduced to one tenth as compared with the arrangement in which the third deflecting coil 29 is abscent. A changing-over switch for selectively changing over the power source to the first, the second and the third deflecting coils (13, 14 and 29) has to be provided.

Figure 5:
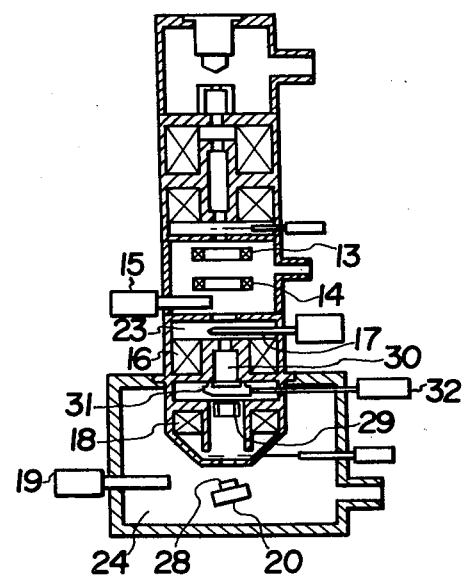
FIG. 5 shows in a vertical sectional view a scanning type electron microscope according to a third embodiment of the invention.

FIG. 5 shows in a vertical sectional view a third exemplary embodiment of the electron microscope according to the invention, in which an intercepting valve 31 is provided in an electron beam passage 30 between the specimen chambers 23 and 24. As will be appreciated, the specimen chamber 24 for a large size specimen is an idle space when a specimen of a small size is to be observed by using the first specimen stage. Accordingly, if the second specimen chamber 24 is evacuated to a desired vacuum level together with the specimen chamber 23 upon observation of the small size specimen, a lot of time will be required for the evacuation. Besides, the desired high vacuum level can not be easily attained within the specimen chamber 23 for the small size specimn due to the fact that gas emitted from the inner walls of the specimen chamber 24, X-ray spectrometer and other added devices will flow into the small-size-specimen chamber 23. With a view to evading such inconvenience, the intercepting valve 31 is provided as the gas flow restricting means in the case of the embodiment shown in FIG. 5. With the provision of the intercepting valve 31, the electron beam passage 30 can be interrupted for observing the small size specimen, so that evacuation is required only for the space located above the first objective lens 16. The intercepting valve 31 is adapted to be selectively operated by an actuator device 32. It should be mentioned that the gas flow restricting means may also be constituted by other devices than the intercepting valve 31 shown in FIG. 5. For example, a cylindrical orifice member having a length of 20 mm and an inner diameter of 1 mm may be mounted in the electron beam passage 30. In this case, the passage 30 is not hermetically interrupted. However, an adequate flow restricting effect can be attained by virtue of the fact that gaseous molecules make linear movement under a vacuum level exceeding about $10^{-3}$ Torr.

Figure 6:
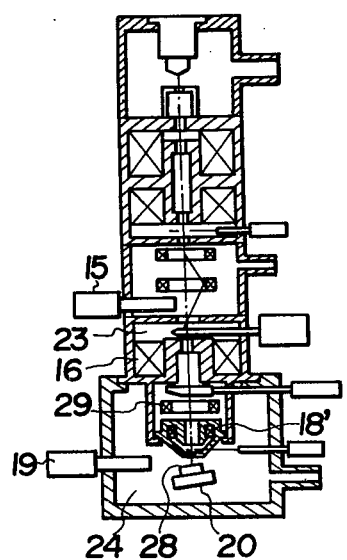
FIG. 6 shows in a vertical sectional view a scanning type electron microscope according to a fourth embodiment of the invention.

FIG. 6 shows in a vertical sectional view a fourth embodiment of the scanning type electron microscope according to the invention, in which a miniature lens 18' is used for the second objective lens. With the term "miniature lens", it is intended to mean a small lens incorporating no deflecting coil therein. In contrast, the normal objective lens is 15 to 20 cm in diameter. As described hereinbefore, since the large size specimen 28 is often to be moved over a considerably large range, it is desirable to provide a space as large as possible around the second specimen table. Further, when X-ray spectral analysis of a specimen is to be performed by using an X-ray spectrometer, the specimen 28 has to be positioned as close as possible to the objective lens to assure a large X-ray exit angle relative to the specimen surface. These requirements can be fulfilled by using the miniature lens for the second objective lens.

With the arrangement of the scanning type electron microscope according to the invention, the center of gravity of the lens column can be set at a low position, whereby a high structural stability as well as insusceptibility to adverse influences of vibration and hence a high image resolution power can be attained. Further, by providing a gas flow restriction between the specimen chamber 23 for the small size specimen and the specimen chamber 24 for the large size specimen, time required for evacuating the specimen chamber 23 to a desired high vacuum level for observing the small size specimen can significantly be decreased. Because the chamber 24 is provided below the chamber 23 for the small size specimen, electron beam for scanning the small size specimen is not subjected to any disturbing influences of external magnetic fields which would otherwise be leaked through notches formed in the large-size-specimen chamber 24. Besides, because of the provision of the second objective lens 18 below the first objective lens 18, a "STEM" image of a specimen mounted on the first specimen table 17 can be observed through the second objective lens 18. When the second objective lens is constituted by the miniature lens, the range within which a specimen is adjustably moved in the specimen chamber 24 can be inceased, while a reduction is involved in the manufacturing costs.

Although the invention has been described in the foregoing in conjunction with the typical embodiments of the invention, it will be appreciated that the invention is never restricted to the disclosures but many modificatons and variations will readily occur to those skilled in the art without departing the spirit and scope of the invention as set forth in claims.

What is claimed is:

1. An electron microscope of a scanning type which can observe the images of different specimens selectively or interchangeably through scanning with the electron beam having an electronic optical system which comprises an electron gun (10), a first objective lens (16) for observing a specimen of small size, a second objective lens (18) for observing a specimen of large size and disposed in axial opposition to said electron gun with said first objective lens, a first specimen table (17) set in a first specimen chamber (23) disposed adjacent to said first objective lens for presenting a small size specimen between magnetic poles of said first objective lens, detection means to detect secondary electrons emitted from a specimen placed on said first specimen table, a second specimen table (20) set in a second specimen chamber (24) disposed below said second objective lens and which is far larger in construction than said first specimen chamber for presenting a large size specimen at a location in the vicinity of the focal plane of said second objective lens, detection means to detect secondary electrons emitted from a specimen placed on said second table, first and second deflecting coils (13) and (14) disposed between said electron gun and said first specimen table so that two-dimensional scanning of the specimen with the electron beam is attained, and a third deflecting coil (29) disposed between said first objective lens and second objective lens so that the electron beam having been two-dimensionally scanned by first and second deflecting coils (13) and (14) is scanned in a wide area in said second specimen chamber.

2. An electron microscope as set forth in claim 1, further comprising means for restricting gas flow, said gas flow restricting means being disposed at the intermediate position of said first specimen chamber and said second specimen chamber, which gas flow restricting means is constructed by a valve means (31) fully intercepting the gas flow between said first and second specimen chamber.

3. An electron microscope as set forth in claim 1, wherein said second objective lens comprises a miniature lens for making said second objective lens portable and for providing a large space around said second specimen table.

* * * * *